(12) United States Patent
Kim et al.

(10) Patent No.: US 8,916,329 B2
(45) Date of Patent: Dec. 23, 2014

(54) HARDMASK COMPOSITION AND ASSOCIATED METHODS

(75) Inventors: Sang Kyun Kim, Gyeonggi-do (KR); Sang Hak Lim, Incheon (KR); Mi Young Kim, Gyeonggi-do (KR); Sang Ran Koh, Gyeonggi-do (KR); Hui Chan Yun, Ulsan (KR); Do Hyeon Kim, Gyeonggi-do (KR); Dong Seon Uh, Seoul (KR); Jong Seob Kim, Daejeon (KR)

(73) Assignee: Cheil Industries, Inc., Gumi-si, Gyeongsangbuk-do (KR)

( * ) Notice: Subject to any disclaimer, the term of this patent is extended or adjusted under 35 U.S.C. 154(b) by 854 days.

(21) Appl. No.: 12/320,874

(22) Filed: Feb. 6, 2009

(65) Prior Publication Data

US 2009/0226824 A1    Sep. 10, 2009

Related U.S. Application Data

(63) Continuation of application No. PCT/KR2006/005916, filed on Dec. 31, 2006.

(30) Foreign Application Priority Data

Aug. 10, 2006  (KR) .......................... 10-2006-0075842

(51) Int. Cl.
*G03F 7/075* (2006.01)
*H01L 21/027* (2006.01)
*C09D 183/04* (2006.01)
*C08G 77/04* (2006.01)
*H01L 21/311* (2006.01)

(52) U.S. Cl.
CPC ...... *H01L 21/31144* (2013.01); *H01L 21/0276* (2013.01); *C09D 183/04* (2013.01); *C08G 77/04* (2013.01)
USPC ..................... 430/270.1; 430/272.1; 522/148; 522/172

(58) Field of Classification Search
USPC ..................... 430/270.1, 272.1; 522/148, 172
See application file for complete search history.

(56) References Cited

U.S. PATENT DOCUMENTS

| 4,374,696 | A   | * | 2/1983  | Schmidt et al.   | 156/329   |
|-----------|-----|---|---------|------------------|-----------|
| 6,576,393 | B1  |   | 6/2003  | Sugita et al.    |           |
| 7,511,296 | B2  | * | 3/2009  | Nakayama et al.  | 257/40    |
| 2003/0236347 | A1 | * | 12/2003 | Furuya et al. | 524/588   |
| 2006/0041078 | A1 | * | 2/2006  | Takei et al.  | 525/329.7 |
| 2007/0212886 | A1 | * | 9/2007  | Uh et al.     | 438/706   |

FOREIGN PATENT DOCUMENTS

| JP | 08-302284 A   | 11/1996 |
|----|---------------|---------|
| JP | 2000-356854 A | 12/2000 |

* cited by examiner

*Primary Examiner* — Daborah Chacko Davis
(74) *Attorney, Agent, or Firm* — Lee & Morse, P.C.

(57) ABSTRACT

A hardmask composition for processing a resist underlayer film includes a solvent and an organosilane polymer, wherein the organosilane polymer is represented by Formula 6:

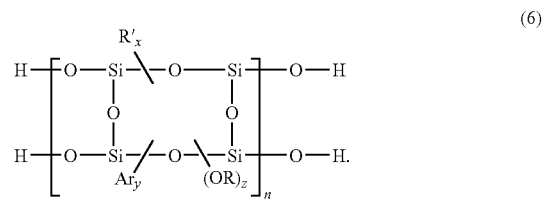

(6)

In Formula 6, R is methyl or ethyl, R' is substituted or unsubstituted cyclic or acyclic alkyl, Ar is an aromatic ring-containing functional group, x, y and z satisfy the relations $x+y=4$, $0.4 \leq x \leq 4$, $0 \leq y \leq 3.6$, and $4 \times 10^{-4} \leq z \leq 1$, and n is from about 3 to about 500.

18 Claims, 10 Drawing Sheets

FIG. 5

Table 1: Storage stability

| Sample | After 10 days | | After 20 days | | After 30 days | |
|---|---|---|---|---|---|---|
| | Normalized molecular weight | Thickness | Normalized molecular weight | Thickness | Normalized molecular weight | Thickness |
| Comparative Example 1 | 1.1 | 512 Å | 1.8 | 532 Å | Particles observed | Poor coating |
| Example 1 | 1.0 | 502 Å | 1.0 | 503 Å | 1.0 | 505 Å |
| Example 2 | 1.0 | 601 Å | 1.0 | 602 Å | 1.0 | 603 Å |

FIG. 6

Table 2: Optical properties

| Sample used in the formation of film | Optical properties (193 nm) | |
|---|---|---|
| | Refractive index (n) | Extinction coefficient (k) |
| Comparative Example 1 | 1.70 | 0.23 |
| Example 1 | 1.77 | 0.23 |
| Example 2 | 1.54 | 0.00 |

FIG. 7

Table 3: Pattern characteristics

| Sample used in the formation of film | Pattern Characteristics | |
|---|---|---|
| | EL margin (ΔmJ/exposure energy mJ) | DoF margin (μm) |
| Comparative Example 1 | 0.2 | 0.2 |
| Example 1 | 0.2 | 0.2 |
| Example 2 | 0.2 | 0.2 |

FIG. 8

Table 4: Pattern shape after etching

| Sample used in the formation of film | Pattern shape after etching |
|---|---|
| Comparative Example 1 | Vertical |
| Example 1 | Vertical |

HARDMASK COMPOSITION AND ASSOCIATED METHODS

CROSS-REFERENCE TO RELATED APPLICATIONS

This application is a continuation of pending PCT Application No. PCT/KR2006/005916, entitled "HARDMASK COMPOSITION FOR RESIST UNDERLAYER FILM AND PROCESS OF PRODUCING SEMICONDUCTOR INTEGRATED CIRCUIT DEVICE USING THE SAME," which was filed on Dec. 31, 2006, and is incorporated by reference herein in its entirety.

BACKGROUND OF THE INVENTION

1. Field of the Invention

Embodiments relate to a hardmask composition and associated methods.

2. Description of the Related Art

Resist materials used in some lithographic techniques may not provide high resistance to the subsequent etching step to an extent sufficient to effectively transfer a desired pattern to a layer underlying the resist material. A hardmask for a resist underlayer film has been used, for example, in the case when an extremely thin resist material is used, a substrate to be etched is thick, a large etching depth is needed, and/or the use of a particular etchant is required depending on the type of substrate.

For better resolution in most lithographic processes, an antireflective coating (ARC) material may be used to minimize the reflectivity between a resist material layer and a substrate. However, the similarity in basic composition between the ARC and the resist material layer may result in poor etch selectivity between the ARC material and the patterned resist layer. Accordingly, consumption of portions of the resist layer may be inevitable during etching of the ARC after patterning, thus requiring further patterning of the resist layer in the subsequent etching step.

A resist pattern may be used as a mask to process a substrate, e.g., a silicon oxide film. Miniaturization of circuits has resulted in a reduction of the thickness of resists, making it difficult for the resists to act as masks. As a result, processing of oxide films without any damage may be impossible. According to a process to overcome these problems, a resist pattern may be transferred to an underlayer film for processing an oxide film, followed by dry etching the oxide film using the pattern-transferred underlayer film as a mask. In this process, since the etching rate of the resist may be similar to that of the underlayer film for processing the oxide film, it may be necessary to form a mask between the resist and the underlayer film to process the underlayer film. Specifically, an underlayer film for processing an oxide film, a mask for processing the underlayer film (i.e., a hardmask for the resist underlayer film), an antireflective film, and a resist may be formed sequentially on the oxide film. This multilayer structure is illustrated in FIG. 2. In this case, the most important requirements of the mask for processing the underlayer film may be etch resistance and high etch selectivity with respect to the underlayer for processing the oxide film. In addition, the mask should not be dissolved by a solvent used to form the antireflective film thereon. That is, the mask should have excellent solvent resistance.

On the other hand, in the case where a hardmask for a resist underlayer film has antireflective properties, there may be no need to form an additional antireflective film. In this case, an underlayer film for processing an oxide film, a mask for processing the underlayer film (i.e., a hardmask for the resist underlayer film), and a resist may be sequentially formed on the oxide film. This multilayer structure is illustrated in FIG. 1.

Various attempts have been made to meet the above requirements. For example, polycondensation reactants of a silane compound may be used as mask materials for processing underlayer films. However, polycondensation of the silane compound may occur in a solution state. When the polycondensation product is used to form a coating after storage for a certain time, the desired thickness of the coating may not be attained. Further, the polycondensation product may be substantially insoluble in solvents because of its high molecular weight, causing many defects to be generated. The polycondensation may be induced by silanol groups (Si—OH) present at the ends of the silane compound.

SUMMARY OF THE INVENTION

Embodiments are therefore directed to a hardmask composition and associated methods, which substantially overcome one or more of the problems due to the limitations and disadvantages of the related art.

It is therefore a feature of an embodiment to provide a hardmask having high etch selectivity.

It is another feature of an embodiment to provide a hardmask having excellent resistance to multiple etching steps.

It is therefore another feature of an embodiment to provide an antireflective hardmask composition that is used to form a good pattern upon processing of a resist due to its excellent ARC effects and allows the pattern to be effectively transferred to a silicon oxide film in the subsequent processing.

It is therefore another feature of an embodiment to provide a hardmask having excellent solvent resistance.

At least one of the above and other features and advantages of these and other embodiments may be realized by providing a hardmask composition for processing a resist underlayer film, including a solvent and an organosilane polymer, wherein the organosilane polymer is represented by Formula 6:

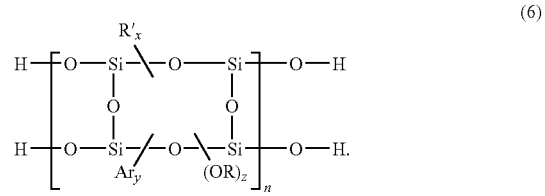

In Formula 6, R is methyl or ethyl, R' is substituted or unsubstituted cyclic or acyclic alkyl, Ar is an aromatic ring-containing functional group, x, y and z satisfy the relations $x+y=4$, $0.4 \leq x \leq 4$, $0 \leq y \leq 3.6$, and $4 \times 10^{-4} \leq z \leq 1$, and n is about 3 to about 500.

The organosilane polymer may be present in an amount of about 1 to about 50 parts by weight and the solvent may be present in an amount of about 50 to about 99 parts by weight, based on 100 parts by weight of the hardmask composition.

The molar percentage of alkoxy groups in the organosilane polymer may be about $1 \times 10^{-2}$ mol % to about 25 mol % with respect to silicon (Si) atoms.

The hardmask composition may further include at least one additive including at least one of a crosslinker, a radical stabilizer, a crosslinking catalyst, and a surfactant.

The crosslinking catalyst may include at least one of pyridinium p-toluenesulfonate, amidosulfobetain-16, (−)-camphor-10-sulfonic acid ammonium salt, ammonium formate, triethylammonium formate, trimethylammonium formate, tetramethylammonium formate, pyridinium formate, ammonium acetate, triethylammonium acetate, trimethylammonium acetate, tetramethylammonium acetate, and pyridinium acetate.

The solvent may include at least one of acetone, tetrahydrofuran, benzene, toluene, diethyl ether, chloroform, dichloromethane, ethyl acetate, propylene glycol methyl ether, propylene glycol ethyl ether, propylene glycol propyl ether, propylene glycol methyl ether acetate, propylene glycol ethyl ether acetate, propylene glycol propyl ether acetate, ethyl lactate, and γ-butyrolactone.

In Formula 6, x, y and z may satisfy the relations x+y=4, $0.4 \leq x \leq 3.96$, $0.04 \leq y \leq 3.6$, and $4 \times 10^{-4} \leq z \leq 1$.

At least one of the above and other features and advantages of these and other embodiments may also be realized by providing a method of preparing a hardmask composition, including preparing an organosilane polymer by polycondensing a first hydrolysate represented by Formula 3 and optionally a second hydrolysate represented by Formula 4:

R'Si[OR]$_n$[OH]$_{3-n}$     (3).

In Formula 3, R is methyl or ethyl, R' is substituted or unsubstituted cyclic or acyclic alkyl, and n is from 0 to 3.

ArSi[OR]$_n$[OH]$_{3-n}$     (4).

In Formula 4, R is methyl or ethyl, Ar is an aromatic ring-containing functional group, and n is from 0 to 3. The organosilane polymer may be combined with a solvent.

The first hydrolysate may be prepared by hydrolyzing, in the presence of water, a solvent, and an acid catalyst, a first compound represented by Formula 1:

[RO]$_3$Si—R'     (1).

In Formula 1, R may be methyl or ethyl and R' is substituted or unsubstituted cyclic or acyclic alkyl.

The second hydrolysate may be prepared by hydrolyzing, in the presence of water, a solvent, and an acid catalyst, a second compound represented by Formula 2:

[RO]$_3$Si—Ar     (2).

In Formula 2, R may be methyl or ethyl and Ar is an aromatic ring-containing functional group.

About 100 parts by weight of the first compound may be hydrolyzed in the presence of about 0.001 to about 5 parts by weight of an acid catalyst, about 10 to about 70 parts by weight of water, and about 100 to about 900 parts by weight of a solvent to form the first hydrolysate.

About 10 to about 99 parts by weight of the first compound and about 1 to about 90 parts by weight of the second compound, the total weight of the two compounds being 100 parts by weight, may be hydrolyzed in the presence of about 0.001 to about 5 parts by weight of an acid catalyst, about 10 to about 70 parts by weight of water, and about 100 to 900 parts by weight of a solvent to form the first hydrolysate and the second hydrolysate.

The acid catalyst may include at least one of nitric acid, sulfuric acid, hydrochloric acid, p-toluenesulfonic acid monohydrate, and diethyl sulfate.

The solvent may include at least one of acetone, tetrahydrofuran, benzene, toluene, diethyl ether, chloroform, dichloromethane, ethyl acetate, propylene glycol methyl ether, propylene glycol ethyl ether, propylene glycol propyl ether, propylene glycol methyl ether acetate, propylene glycol ethyl ether acetate, propylene glycol propyl ether acetate, ethyl lactate, and γ-butyrolactone.

The polycondensation may be carried out in the presence of about 0.002 to about 10 parts by weight of a base catalyst.

The base catalyst may include at least one of trimethylamine, triethylamine, tripropylamine, tributylamine, benzylamine, dimethylbenzylamine, aniline, N-dimethylaniline, pyridine, pyrrole, pyrrolidine, piperidine, imidazole, indole, sodium hydroxide (NaOH), potassium hydroxide (KOH), and calcium hydroxide (Ca(OH)$_2$).

Preparing the organosilane polymer may include polycondensing the second hydrolysate.

At least one of the above and other features and advantages of these and other embodiments may also be realized by providing a method for producing a semiconductor integrated circuit device, including providing a material layer on a substrate, forming a first hardmask layer including an organic material on the material layer, coating the first hardmask layer with a hardmask composition according to an embodiment to form a second hardmask layer, forming a radiation-sensitive imaging layer on the second hardmask layer, patternwise exposing the imaging layer to radiation to form a pattern of radiation-exposed regions in the imaging layer, selectively removing portions of the radiation-sensitive imaging layer and the second hardmask layer to expose portions of the first hardmask layer, selectively removing portions of the patterned second hardmask layer and the first hardmask layer to expose portions of the material layer, and etching the exposed portions of the material layer to pattern the material layer.

The method may further include forming an antireflective coating layer on the second hardmask layer prior to forming a radiation-sensitive imaging layer on the second hardmask layer.

BRIEF DESCRIPTION OF THE DRAWINGS

The above and other features and advantages of the present invention will become more apparent to those of ordinary skill in the art by describing in detail exemplary embodiments thereof with reference to the attached drawings, in which:

FIG. 5 illustrates Table 1 listing storage stabilities for samples prepared in Comparative Example 1 and Examples 1 and 2;

FIG. 6 illustrates Table 2 listing Optical properties for samples prepared in Comparative Example 1 and Examples 1 and 2;

FIG. 7 illustrates Table 3 listing Pattern characteristics for samples prepared in Comparative Example 1 and Examples 1 and 2; and FIG. 8 illustrates Table 4 listing the Pattern shape after etching for samples prepared in Comparative Example 1 and Examples 1 and 2.

DETAILED DESCRIPTION OF THE INVENTION

Figure 1:
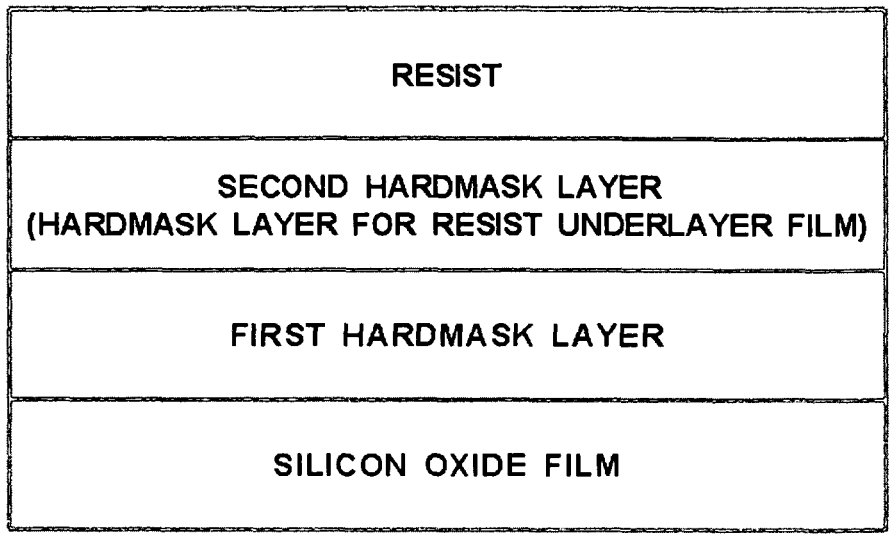
FIGS. 1 and 2 illustrate cross-sectional views of multilayer structures, each of which include a second hardmask layer formed using a hardmask composition of the present invention, in lithographic processes for the production of semiconductor integrated circuit devices.

Korean Patent Application No. 10-2006-0075842, filed on Aug. 10, 2006, in the Korean Intellectual Property Office, and entitled: "Hardmask Composition for Resist Underlayer Film and Process of Producing Semiconductor Integrated Circuit Device Using the Same," is incorporated by reference herein in its entirety.

Example embodiments will now be described more fully hereinafter with reference to the accompanying drawings;

however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

As used herein, the expressions "at least one," "one or more," and "and/or" are open-ended expressions that are both conjunctive and disjunctive in operation. For example, each of the expressions "at least one of A, B, and C," "at least one of A, B, or C," "one or more of A, B, and C," "one or more of A, B, or C" and "A, B, and/or C" includes the following meanings: A alone; B alone; C alone; both A and B together; both A and C together; both B and C together; and all three of A, B, and C together. Further, these expressions are open-ended, unless expressly designated to the contrary by their combination with the term "consisting of." For example, the expression "at least one of A, B, and C" may also include an $n^{th}$ member, where n is greater than 3, whereas the expression "at least one selected from the group consisting of A, B, and C" does not.

As used herein, the expression "or" is not an "exclusive or" unless it is used in conjunction with the term "either." For example, the expression "A, B, or C" includes A alone; B alone; C alone; both A and B together; both A and C together; both B and C together; and all three of A, B, and C together, whereas the expression "either A, B, or C" means one of A alone, B alone, and C alone, and does not mean any of both A and B together; both A and C together; both B and C together; and all three of A, B, and C together.

As used herein, the terms "a" and "an" are open terms that may be used in conjunction with singular items or with plural items. For example, the term "a crosslinking catalyst" may represent a single compound, e.g., ammonium formate, or multiple compounds in combination, e.g., ammonium formate mixed with pyridiunium formate.

As used herein, molecular weights of polymeric materials are weight average molecular weights, unless otherwise indicated.

Embodiments provide a hardmask composition which may be used for processing a resist underlayer film. Embodiments also provide a hardmask composition which may provide antireflective properties. The hardmask composition may include an organosilane polymer represented by Formula 6:

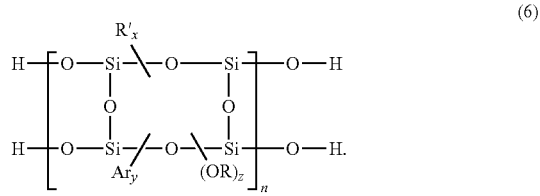

(6)

In Formula 6, R may be methyl or ethyl, R' may be substituted or unsubstituted cyclic or acyclic alkyl, Ar may be an aromatic ring-containing functional group, x, y and z may satisfy the relations x+y=4, 0.4≤x≤4, 0≤y≤3.6, and $4 \times 10^{-4} \leq z \leq 1$, and n may be about 3 to about 500.

In Formula 6, each of R' and Ar represent a functional group bonded to a Si atom. The group OR represents a portion of the polymer backbone Si—O—Si that is changed to Si—OR. The number of the respective functional groups (R', Ar and OR) per unit 'n' may be x, y, and z, respectively, as defined in Formula 6.

It is preferred to limit the molar percentage of alkoxy groups (OR) in the organosilane polymer to about $1 \times 10^{-2}$ mol % to about 25 mol % with respect to silicon (Si) atoms, i.e., $4 \times 10^{-4} \leq z \leq 1$. Maintaining the molar percentage of alkoxy groups at about 25 mol % or less may help ensure that film characteristics (e.g., solvent resistance) are not deteriorated. Maintaining the molar percentage of alkoxy groups at about $1 \times 10^{-2}$ mol % or greater may help ensure satisfactory storage stability.

The organosilane polymer may be present in the composition in an amount of about 1 to about 50 parts by weight, based on 100 parts by weight of the hardmask composition. The solvent may be present in the composition in an amount of about 50 to about 99 parts by weight, based on 100 parts by weight of the hardmask composition, i.e., about 50 to about 99% by weight of the composition may be solvent. The contents of the organosilane polymer and the solvent may vary depending on a desired thickness of a hardmask coating formed using the hardmask composition of an embodiment.

The solvent in the hardmask composition of an embodiment may include at least one of acetone, tetrahydrofuran, benzene, toluene, diethyl ether, chloroform, dichloromethane, ethyl acetate, propylene glycol methyl ether, propylene glycol ethyl ether, propylene glycol propyl ether, propylene glycol methyl ether acetate, propylene glycol ethyl ether acetate, propylene glycol propyl ether acetate, ethyl lactate, and γ-butyrolactone.

The solvent may be the same as or different from the reaction solvent used in the polycondensation described below.

The hardmask composition of an embodiment may further include at least one additive including crosslinkers, radical stabilizers, crosslinking catalysts, and surfactants.

Suitable crosslinking catalysts may include sulfonic acid salts of organic bases, e.g., pyridinium p-toluenesulfonate, amidosulfobetain-16, and (−)-camphor-10-sulfonic acid ammonium salt; formic acid salts of organic bases, e.g., ammonium formate, triethylammonium formate, trimethylammonium formate, tetramethylammonium formate, and pyridinium formate; and acetic acid salts of organic bases, e.g., ammonium acetate, triethylammonium acetate, trimethylammonium acetate, tetramethylammonium acetate, and pyridinium acetate.

These crosslinking catalyst compounds may play a role in promoting the crosslinking of the organosilane polymer to improve the etch resistance and solvent resistance of the hardmask composition. The crosslinking catalyst compound is preferably used in an amount of about 0.0001 to about 0.01 parts by weight, based on 100 parts by weight of the organosilane polymer. Maintaining the amount of the crosslinking catalyst compound at about 0.0001 parts by weight or greater may help ensure the improvement of the etch resistance and solvent resistance of the hardmask composition. Maintaining the amount of the crosslinking catalyst at about 0.01 parts by weight or less may help ensure that the storage stability of the hardmask composition is sufficient.

Another embodiment provides a method of forming the organosilane polymer used in the hardmask composition. The organosilane polymer represented by Formula 6 may be prepared by hydrolysis and polycondensation of precursor compounds represented by Formula 1 in the presence of an acid catalyst. In another embodiment, the organosilane polymer represented by Formula 6 may be prepared by hydrolysis and polycondensation of precursor compounds represented by Formulae 1 and 2 in the presence of an acid catalyst.

$$[RO]_3Si—R' \quad (1)$$

$$[RO]_3Si—Ar \quad (2)$$

In Formula 1, R may be methyl or ethyl, and R' may be substituted or unsubstituted cyclic or acyclic alkyl.

In Formula 2, R may be methyl or ethyl, and Ar may be an aromatic ring-containing functional group.

Figure 4A:
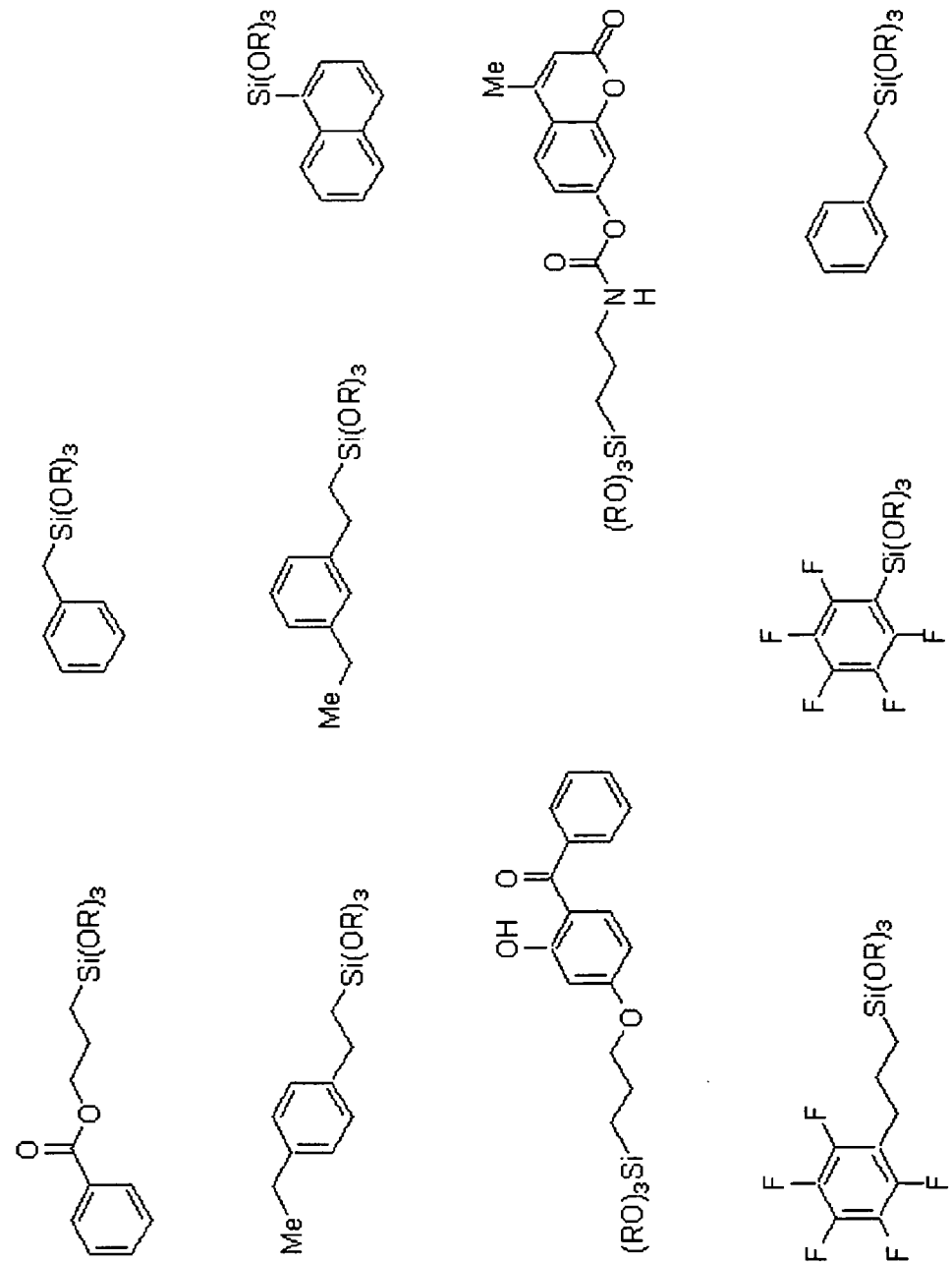
FIGS. 4a-4b illustrate exemplary compounds represented by Formula 2.
Figure 4B:
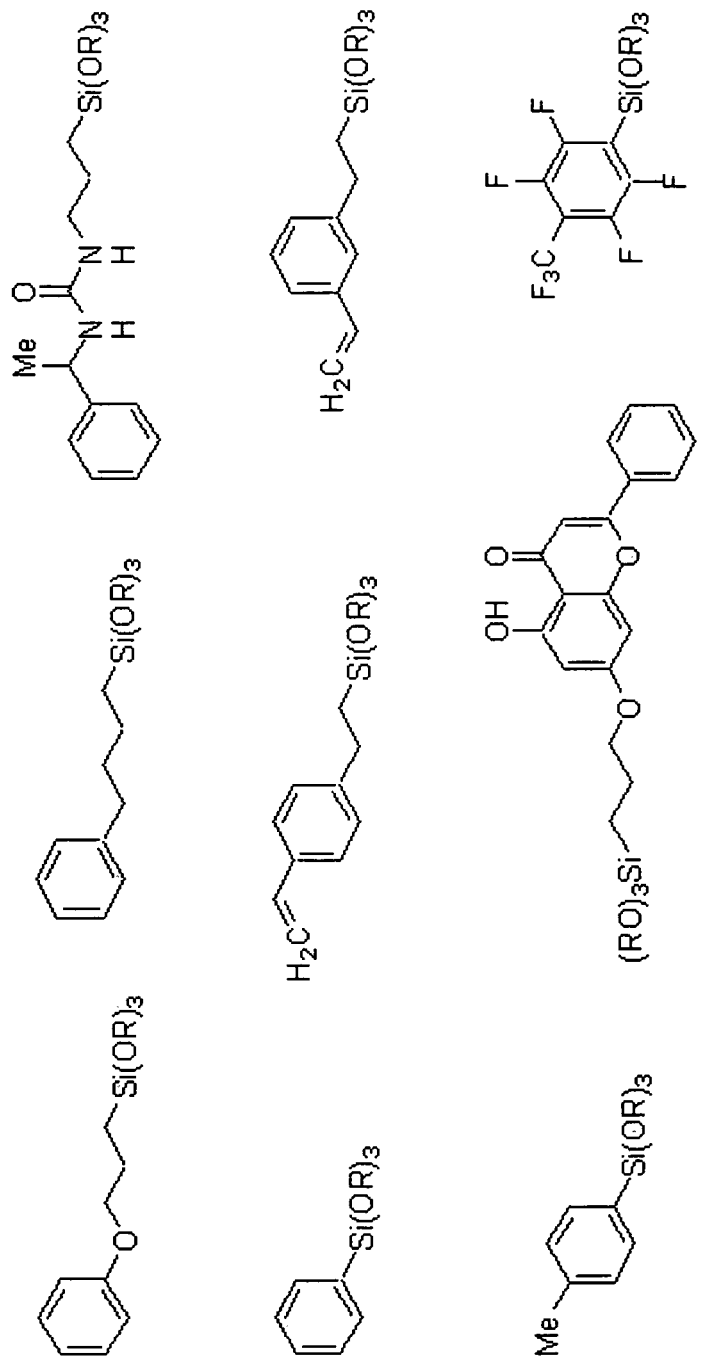

Specific exemplary compounds corresponding to Formulae 1 and 2 are shown in FIGS. 3 and 4, respectively.

The organosilane polymer may be a polycondensation product of hydrolysates represented by Formulae 3 and 4:

$$R'Si[OR]_n[OH]_{3-n} \quad (3)$$

$$ArSi[OR]_n[OH]_{3-n} \quad (4).$$

In Formula 3, R may be methyl or ethyl, R' may be substituted or unsubstituted cyclic or acyclic alkyl, and n may be from 0 to 3.

In Formula 4, R may be methyl or ethyl, Ar may be an aromatic ring-containing functional group, and n may be from 0 to 3.

The organosilane polymer of an embodiment may be prepared by hydrolyzing about 100 parts by weight of the compound of Formula 1 in the presence of about 0.001 to about 5 parts by weight of an acid catalyst, about 10 to about 70 parts by weight of water, and about 100 to about 900 parts by weight of a solvent to obtain a mixture of hydrolysates. This may be followed by polycondensation of the mixture without further purification. The polycondensation may be carried out in the presence of about 0.002 to about 10 parts by weight of a base catalyst.

The number of alkoxy groups in the final polycondensation product may be controlled by varying the amount of water used to hydrolyze the compounds of Formulae 1 and 2. The storage stability of the hardmask composition according to an embodiment may be determined by the number of alkoxy groups in the polycondensation product.

The hydrolysates of Formulae 3 and 4 may be obtained by hydrolyzing the compounds of Formulae 1 and 2, respectively, in the presence of an acid catalyst. The hydrolysates of Formula 3 or 4 may include hydrolysates in which the three alkoxy groups of the compound of Formula 1 or 2 are converted to hydroxyl groups, hydrolysates in which two of the three alkoxy groups included in the compound of Formula 1 or 2 are converted to hydroxyl groups, and hydrolysates in which one of the three alkoxy groups included in the compound of Formula 1 or 2 is converted to a hydroxyl group. The mixture of the hydrolysates may include the compound of Formula 1 or 2 in which the three alkoxy groups all remain unchanged.

Taking advantage of the ability of the aromatic group (Ar) included in the compound of Formula 2 to absorb UV light, the hardmask composition of the present invention may exhibit excellent antireflective properties due to high UV absorbance of the organosilane polymer. The hardmask composition of an embodiment may have a desired absorbance and refractive index in a particular wavelength region by controlling the ratio of the aromatic group to the groups R' and R.

In the case where the compound of Formula 2 is used to prepare the hardmask composition of an embodiment (i.e. if antireflective film characteristics are desired), it is preferable to use the compound of Formula 2 in an amount of about 1 to about 90 parts by weight, based on the total weight (100 parts by weight) of the compounds of Formulae 1 and 2. Maintaining the amount of the compound of Formula 2 at about 1 part by weight or greater may help ensure the hardmask has sufficient absorbance. Maintaining the amount of the compound of Formula 2 at about 90 parts by weight or less may help ensure sufficient etch selectivity due to sufficient Si content. Suitable antireflective properties may be attained by controlling the relative amount of the compound of Formula 2 used. For example, when the compound of Formula 2 has a phenyl group as the aromatic group, and is used in an amount of 10 parts by weight, an absorbance (k) of about 0.2 may be obtained.

It is preferable to use the compound of Formula 1 in an amount of about 10 to about 99 parts by weight, based on the total weight (100 parts by weight) of the compounds of Formulae 1 and 2. Maintaining the amount of the compound of Formula 1 at about 10 parts by weight or greater may help ensure sufficient etch selectivity due to adequate Si content. Maintaining the amount of the compound of Formula 1 at about 99 parts by weight or less may help ensure sufficient amounts of the compound of Formula 2 and maintenance of antireflective film characteristics.

An increase in the relative amount of the compound of Formula 1 used may lead to an increase in the content of Si in the hardmask composition of an embodiment. Suitable etch selectivity between an overlying photoresist layer and an underlying hardmask layer composed of an organic material may be imparted by varying the Si content of the hardmask composition according to an embodiment.

The acid catalyst preferably includes at least one of nitric acid, sulfuric acid, hydrochloric acid, p-toluenesulfonic acid monohydrate, and diethyl sulfate. The hydrolysis reactions may be suitably controlled by varying the kind, the amount, and the addition mode of the acid catalyst. Further, the acid catalyst added for the hydrolysis reactions may also be reused as a catalyst for the polycondensation reaction.

In the hydrolysis reactions of the compounds of Formulae 1 and 2, and polycondensation of the hydrolysates, the acid catalyst may be used in an amount of about 0.001 to about 5 parts by weight. Maintaining the amount of the acid catalyst at about 0.001 parts by weight or greater may help ensure sufficient reaction rates. Maintaining the amount of the acid catalyst at about 5 parts by weight or less may help ensure sufficiently slow reaction rates, making it possible to prepare a polycondensation product having a desired molecular weight.

The solvent used in the preparation of the organosilane polymer preferably includes at least one of acetone, tetrahydrofuran, benzene, toluene, diethyl ether, chloroform, dichloromethane, ethyl acetate, propylene glycol methyl ether, propylene glycol ethyl ether, propylene glycol propyl ether, propylene glycol methyl ether acetate, propylene glycol ethyl ether acetate, propylene glycol propyl ether acetate, ethyl lactate, or γ-butyrolactone.

A base catalyst may also be used during the polycondensation. The base catalyst may include at least one of organic bases, e.g., trimethylamine, triethylamine, tripropylamine, tributylamine, benzylamine, dimethylbenzylamine, aniline, N-dimethylaniline, pyridine, pyrrole, pyrrolidine, piperidine, imidazole, and indole; and inorganic bases, e.g., sodium hydroxide (NaOH), potassium hydroxide (KOH), and calcium hydroxide (Ca(OH)$_2$).

The polycondensation may be suitably controlled by varying the kind, the amount, and the addition mode of the base catalyst. In the polycondensation of the hydrolysates, the base catalyst may be used in an amount of about 0.002 to about 10 parts by weight. Maintaining the amount of the base catalyst at about 0.002 parts by weight or greater may help ensure a sufficient reaction rate. Maintaining the amount of the base catalyst at about 10 parts by weight or less may help ensure a sufficiently slow reaction rate, making it possible to prepare a polycondensation product having a desired molecular weight.

An exemplary embodiment also provides a method for producing a semiconductor integrated circuit device, as shown in FIG. 1. The method may include providing a material layer on a substrate, forming a first hardmask layer including an organic material on the material layer, coating the hardmask composition of an embodiment on the first hardmask to form a second hardmask layer, forming a radiation-sensitive imaging layer on the second hardmask layer, patternwise exposing the imaging layer to radiation to form a pattern of radiation-exposed regions in the imaging layer, selectively removing portions of the radiation-sensitive imaging layer and the second hardmask layer to expose portions of the first hardmask layer, selectively removing portions of the patterned second hardmask layer and the first hardmask layer to expose portions of the material layer, and etching the exposed portions of the material layer to pattern the material layer.

Figure 2:
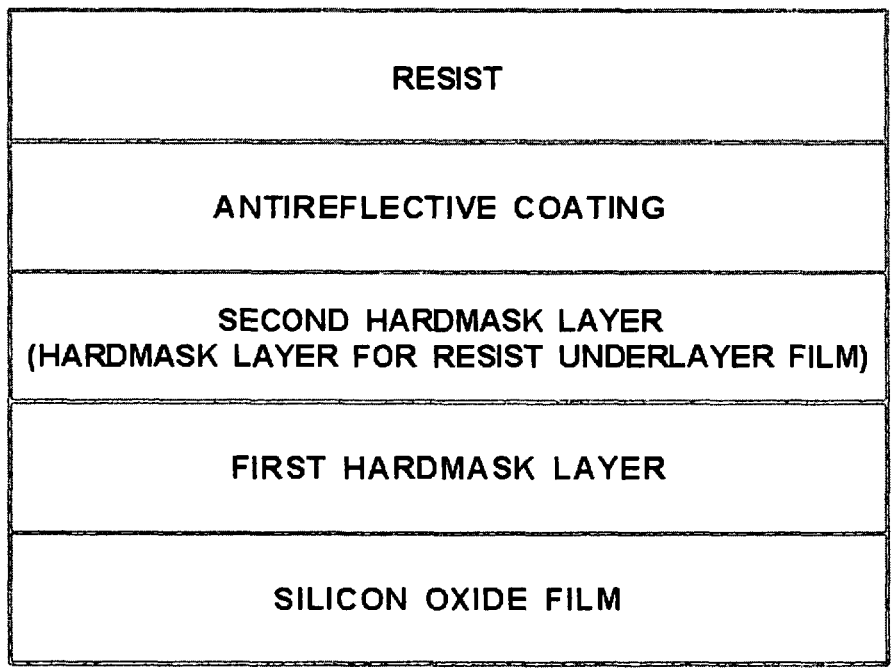
Figure 3A:
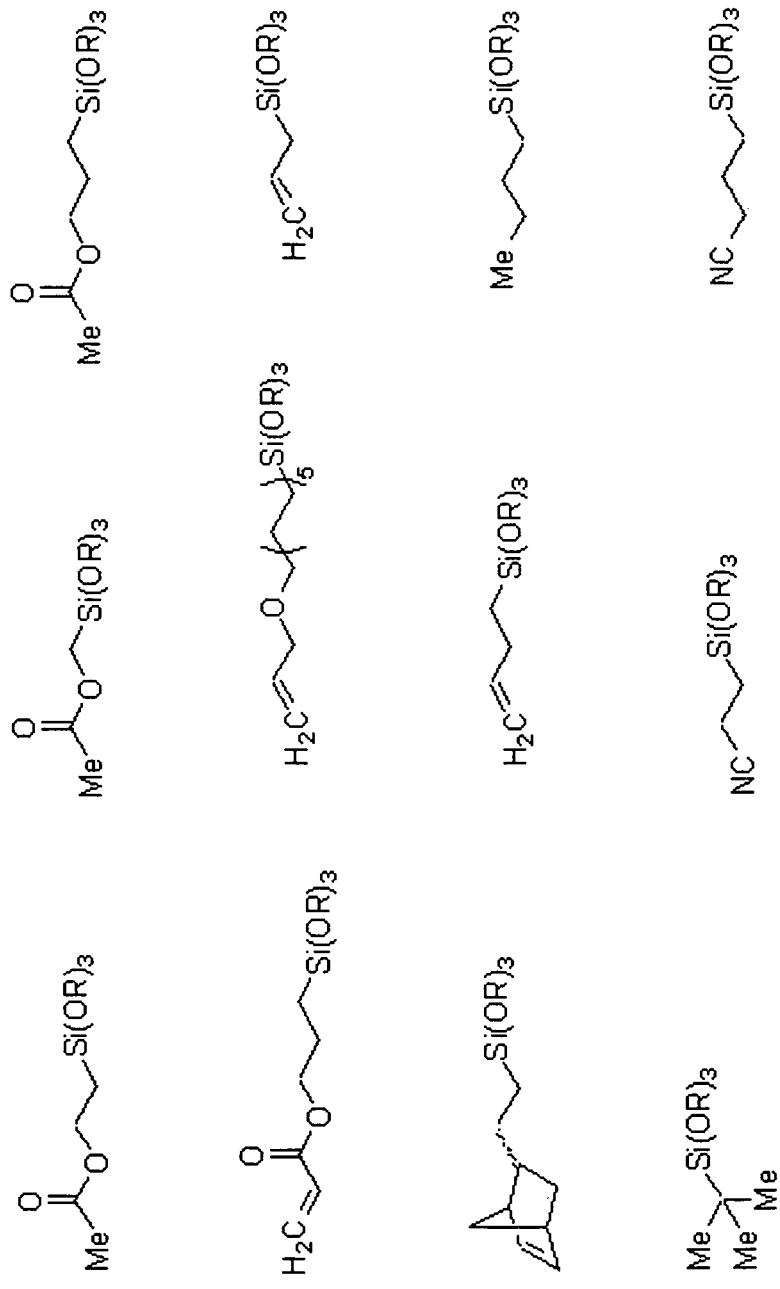
FIGS. 3a-3e illustrate exemplary compounds represented by Formula 1.
Figure 3B:
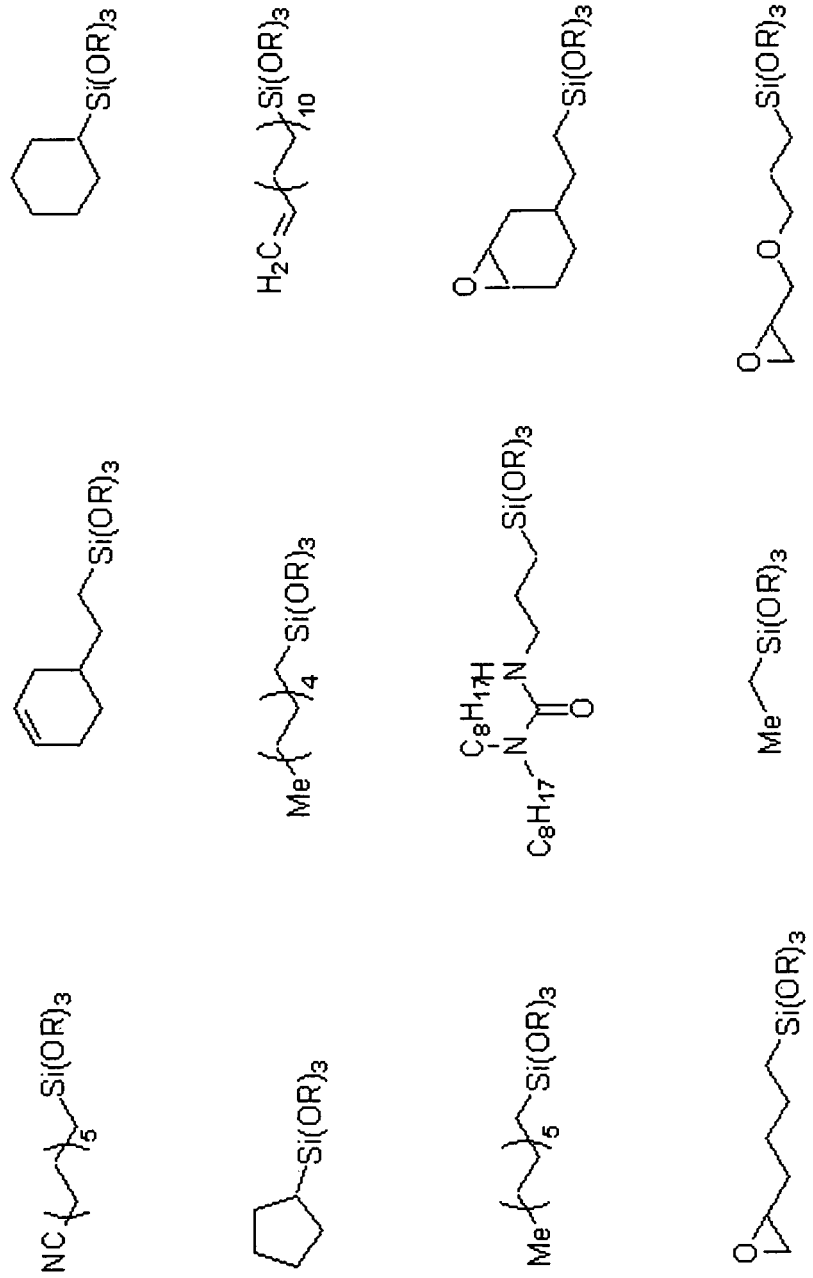
Figure 3C:
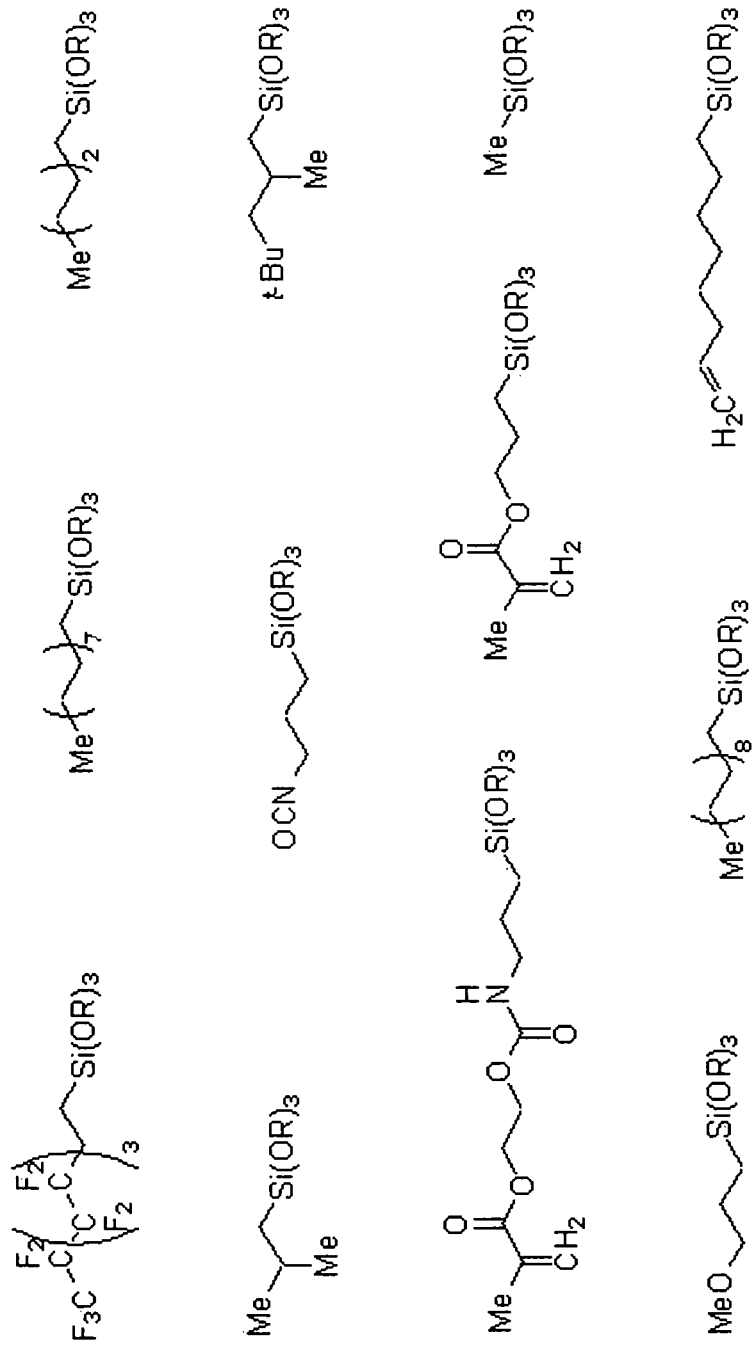
Figure 3D:
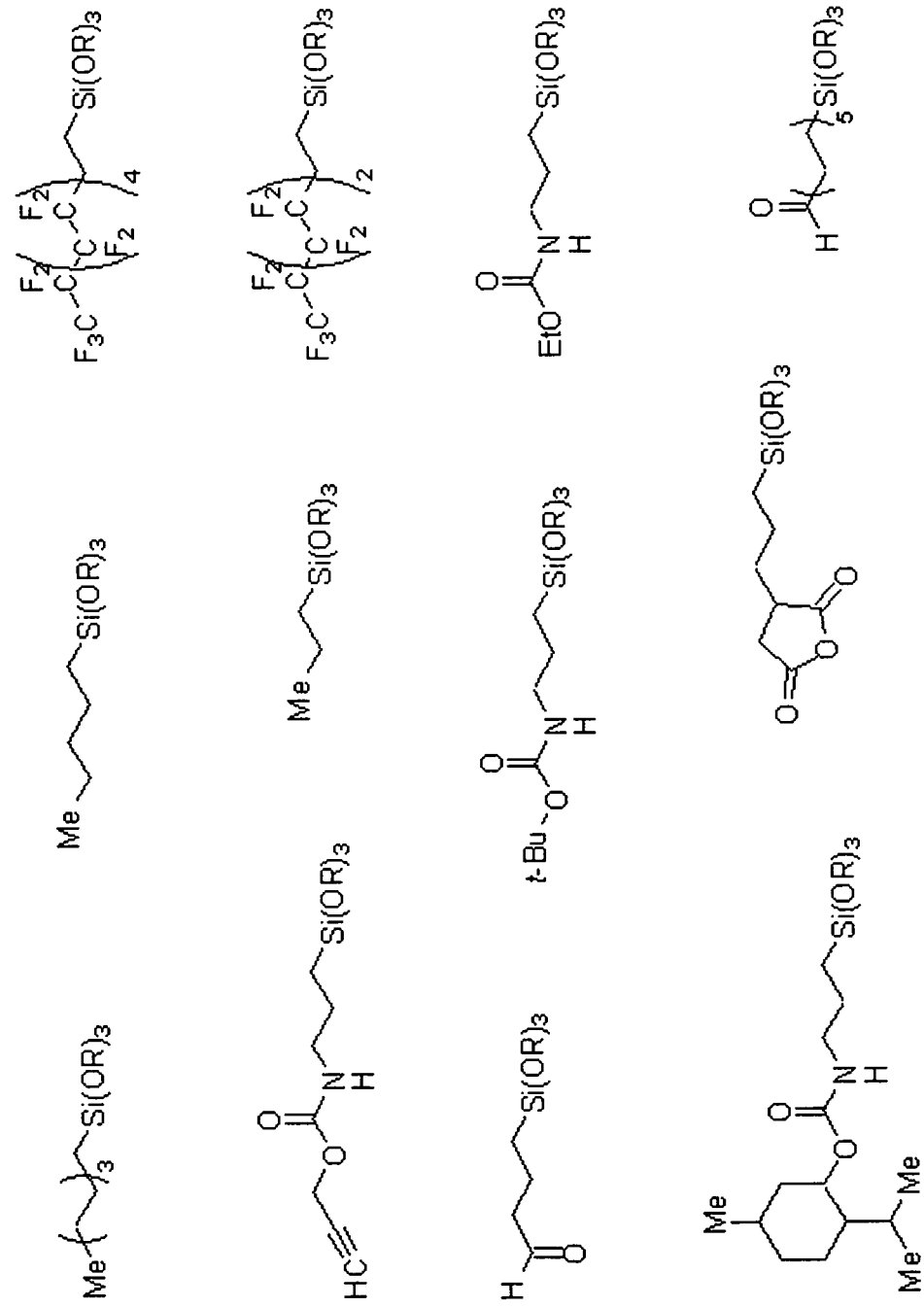
Figure 3E:
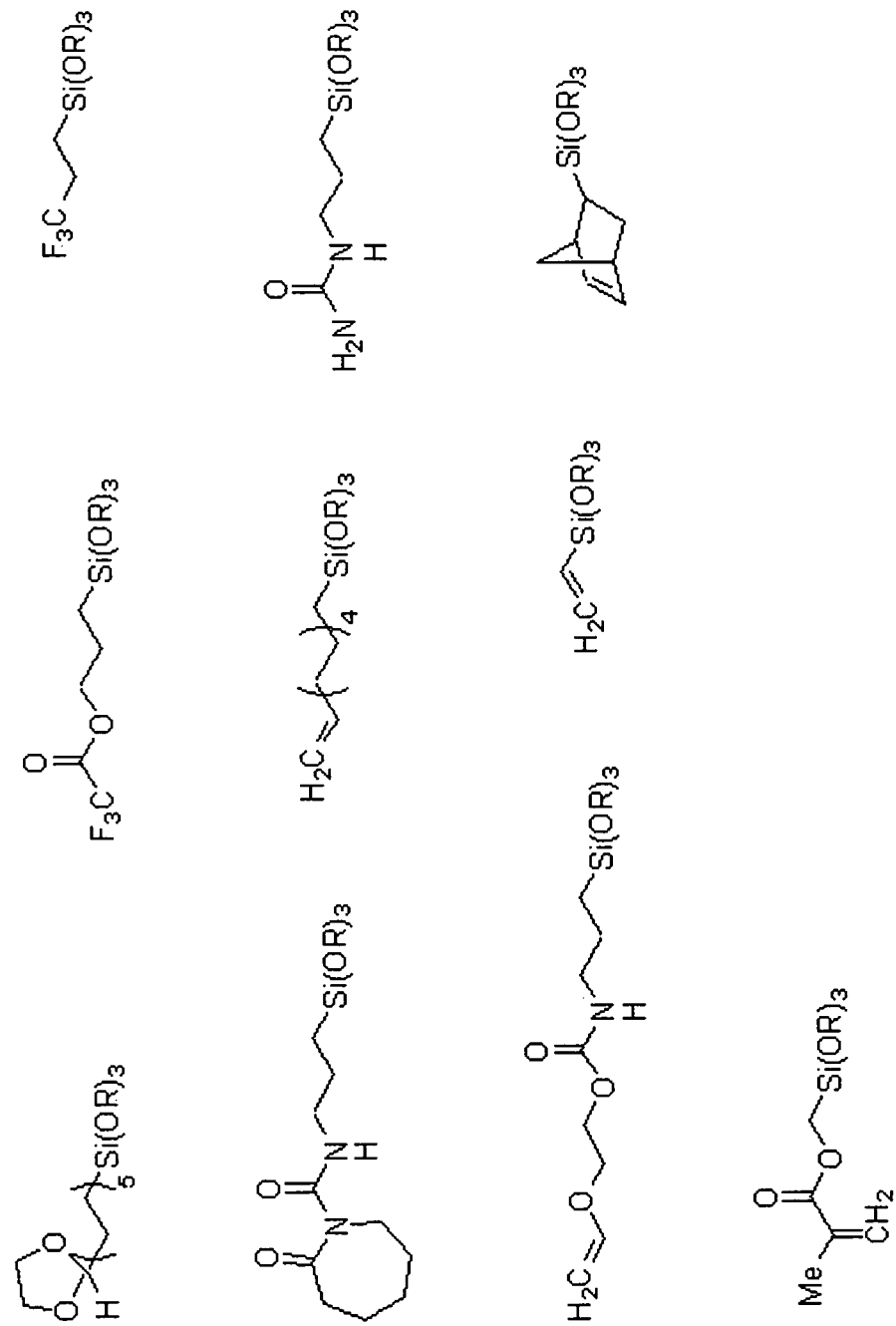

As shown in FIG. 2, the method of the present invention may further include forming an antireflective coating layer on the second hardmask layer prior to forming a radiation-sensitive imaging layer on the second hardmask layer. This additional step may be applied when it is desired to further strengthen the antireflective function of the second hardmask layer, or when the second hardmask layer has no antireflective function.

Hereinafter, exemplary embodiments will be explained in more detail with reference to the following examples. However, these examples are given for the purpose of illustration and are not to be construed as limiting the scope of the invention.

EXAMPLES

Comparative Example 1

In this comparative example, Si—H and Si—OH were employed as functional groups that induce crosslinking reactions. Si—H is widely used as a functional group capable being easily condensed with Si—OH.

1,750 g of methyltrimethoxysilane, 340 g of phenyltrimethoxysilane and 313 g of trimethoxysilane were dissolved in 5,600 g of propylene glycol methyl ether acetate (PGMEA) in a 10-liter four-neck flask equipped with a mechanical agitator, a condenser, a dropping funnel, and a nitrogen introduction tube. Then, 925 g of an aqueous nitric acid solution (1,000 ppm) was added to the solution. After the resulting mixture was allowed to react at 60° C. for one hour, the formed methanol was removed under reduced pressure. The reaction was continued for one week while maintaining a reaction temperature of 50° C. After completion of the reaction, hexane was added to the reaction mixture to precipitate the polymer of Formula 7.

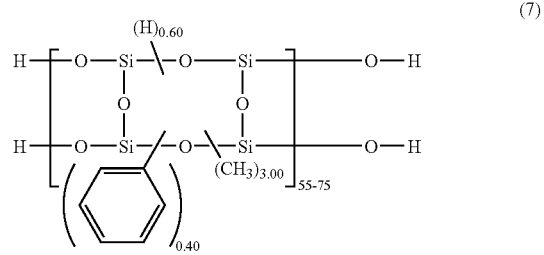

100 g of propylene glycol methyl ether acetate (PGMEA) and 100 g of ethyl lactate were added to 4.0 g of the polymer to prepare a dilute solution of the polymer. To the dilute solution was added 0.004 g of pyridinium p-toluenesulfonate. The resulting solution was spin-coated on a silicon wafer coated with an underlayer film for processing an oxide film, followed by baking at 240° C. for 60 seconds to form a 500 Å-thick film.

Example 1

850 g of methyltrimethoxysilane and 150 g of phenyltrimethoxysilane were dissolved in 2,500 g of propylene glycol methyl ether acetate (PGMEA) in a 10-liter four-neck flask equipped with a mechanical agitator, a condenser, a dropping funnel, and a nitrogen introduction tube. Then, 260 g of an aqueous nitric acid solution (1,000 ppm) was added to the solution. After the resulting mixture was allowed to react at 60° C. for one hour, the formed methanol was removed under reduced pressure. 0.4 g of triethylamine was added to the reaction mixture, and the reaction was continued for one week while maintaining a reaction temperature of 80° C. After completion of the reaction, hexane was added to the reaction mixture to precipitate the polymer of Formula 8.

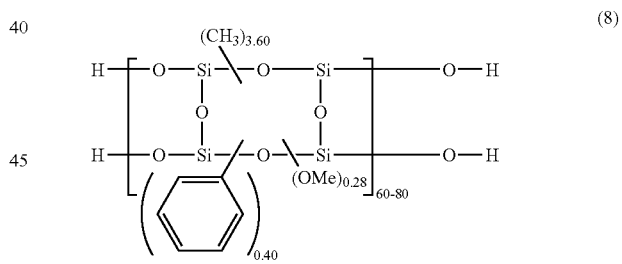

100 g of propylene glycol methyl ether acetate (PGMEA) and 100 g of ethyl lactate were added to 4.0 g of the polymer to prepare a dilute solution of the polymer. To the dilute solution was added 0.004 g of pyridinium p-toluenesulfonate. The resulting solution was spin-coated on a silicon wafer coated with an underlayer film for processing an oxide film, followed by baking at 240° C. for 60 seconds to form a 500 Å-thick film.

Example 2

480 g of methyltrimethoxysilane was dissolved in 1,120 g of propylene glycol methyl ether acetate (PGMEA) in a 20-liter four-neck flask equipped with a mechanical agitator, a condenser, a dropping funnel, and a nitrogen introduction tube. Then, 130 g of an aqueous nitric acid solution (1,000 ppm) was added to the solution. After the resulting mixture was allowed to react at 60° C. for one hour, the formed methanol was removed under reduced pressure. The reaction was continued for one week while maintaining a reaction temperature of 80° C. After completion of the reaction, hexane was added to the reaction mixture to precipitate the polymer of Formula 9.

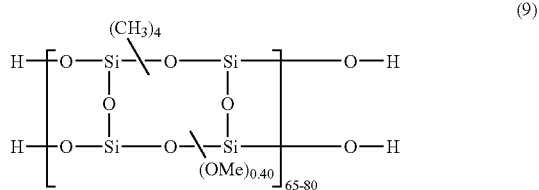

(9)

100 g of propylene glycol propyl ether (PGPE) was added to 4.0 g of the polymer to prepare a dilute solution of the polymer. To the dilute solution was added 0.004 g of pyridinium p-toluenesulfonate. The resulting solution was spin-coated on a silicon wafer coated with an underlayer film for processing an oxide film, followed by baking at 240° C. for 60 seconds to form a 600 Å-thick film.

Experimental Example 1

The solutions prepared in Comparative Example 1 and Examples 1 and 2 were tested for storage stability. Each of the solutions was stored at 40° C. At intervals of 10 days, the state of the solution was observed and the thickness of the film after coating of the solution was measured. The results are shown in Table 1 in FIG. 5.

The normalized molecular weight as shown in Table 1 refers to a value obtained by dividing the molecular weight of the polymer measured after the predetermined time of storage by the molecular weight of the polymer measured immediately after the preparation of the polymer. An increase in the molecular weight of the polymer prepared in Comparative Example 1 after the predetermined time intervals of storage was observed, indicating the occurrence of condensation between the silane compounds present within the solution prepared in Comparative Example 1. In contrast, the molecular weights of the polymers prepared in Examples 1 and 2 were maintained even after the passage of the crosslinking time, indicating improved storage stability of the solutions.

Experimental Example 2

The refractive index (n) and extinction coefficient (k) of the films formed in Comparative Example 1 and Examples 1 and 2 were measured using an Ellipsometer (J. A. Woollam). The results are shown in Table 2 in FIG. 6.

As can be seen from Table 2, the films formed in Comparative Example 1 and Example 1 showed good optical properties at an exposure light source of 193 nm. The introduction of Si—OR into the polymer prepared in Example 1 could be confirmed to have no negative influence on the optical properties of the mask.

The extinction coefficient (0.00) of the film formed in Example 2 indicates that the film had no antireflective function.

Experimental Example 3

An ArF photoresist was coated on each of the films formed in Comparative Example 1 and Example 1, baked at 110° C. for 60 seconds, exposed to light using an ArF exposure system (ASML1250, FN70 5.0 active, NA 0.82), and developed with an aqueous solution of TMAH (2.38 wt %) to form an 80-nm line and space pattern. The pattern was observed using a field emission scanning electron microscope (FE-SEM).

The procedure was repeated except that an antireflective film was coated on the film formed in Example 2 before coating of the photoresist to form a resist pattern. The resist pattern was observed in the same manner as above.

The patterns were measured for exposure latitude (EL) margin as a function of exposure energy and depth of focus (DoF) margin as a function of the distance from a light source. The results are recorded in Table 3 in FIG. 7.

The patterns all showed good photoprofile. From these results, it could be confirmed that the introduction of Si—OR did not adversely affect the photoprofile of the photoresists.

Experimental Example 4

The patterned specimens obtained in Experimental Example 3 were sequentially dry-etched using a $CF_x$ plasma, an $O_2$ plasma, and a $CF_x$ plasma. The remaining organic materials were completely removed using $O_2$, and the cross sections of the specimens were observed using an FE-SEM. The results are listed in Table 4 in FIG. 8.

The specimens all showed good etch characteristics. These results reveal that the introduction of Si—OR had no negative influence on the etch resistance, etch selectivity, and etch profile of the masks.

Exemplary embodiments of the present invention have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A hardmask composition for processing a resist underlayer film, comprising:
   a solvent;
   a crosslinking catalyst, wherein the crosslinking catalyst includes at least one of pyridinium p-toluenesulfonate, amidosulfobetain-16, (−)-camphor-10-sulfonic acid ammonium salt, ammonium formate, triethylammonium formate, trimethylammonium formate, tetramethylammonium formate, pyridinium formate, ammonium acetate, triethylammonium acetate, trimethylammonium acetate, tetramethylammonium acetate, and pyridinium acetate; and
   an organosilane polymer, wherein the organosilane polymer is represented by Formula 6:

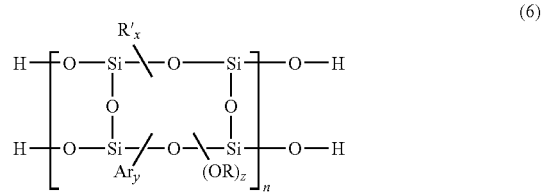

(6)

wherein R is methyl or ethyl, Ar is an aromatic ring-containing functional group, x, y and z satisfy the relations x+y=4, 0.4≤x≤4, 0≤y≤3.6, and $4\times10^{-4}\leq z\leq 1$, n is about 3 to about 500, and R' is a moiety bound to silicon of the organosilane polymer, the silicon-bonded R' moiety being a hydrolyzed moiety of a first compound selected from:
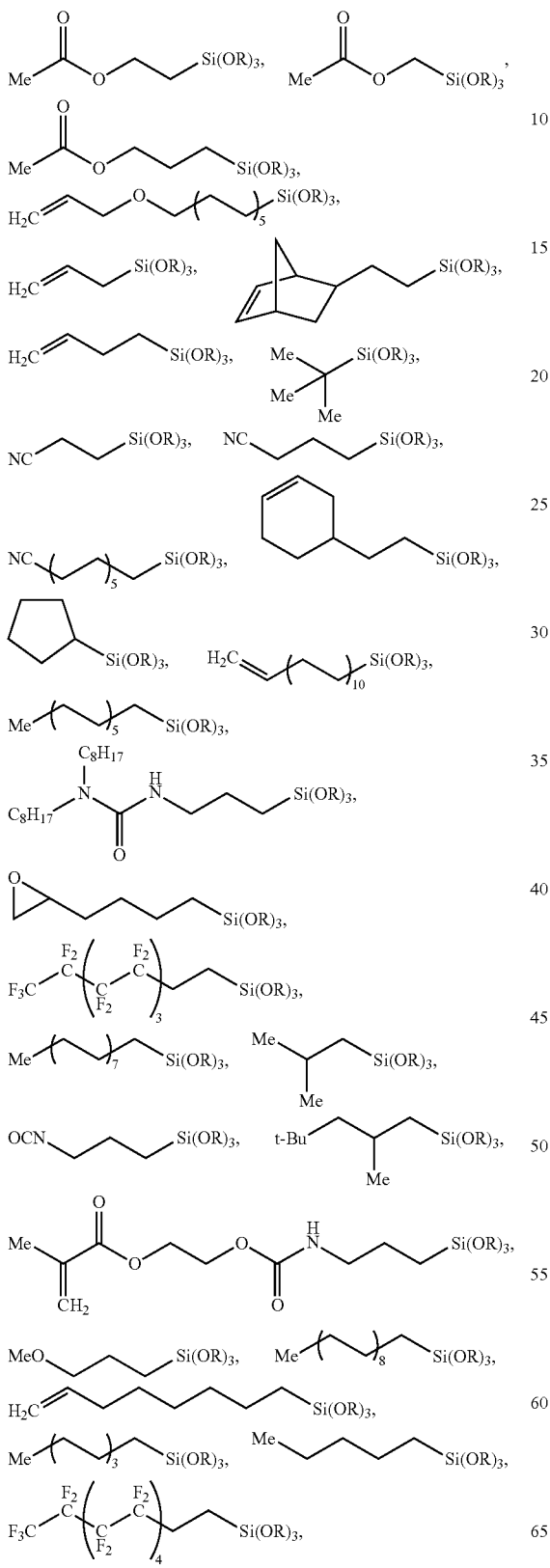
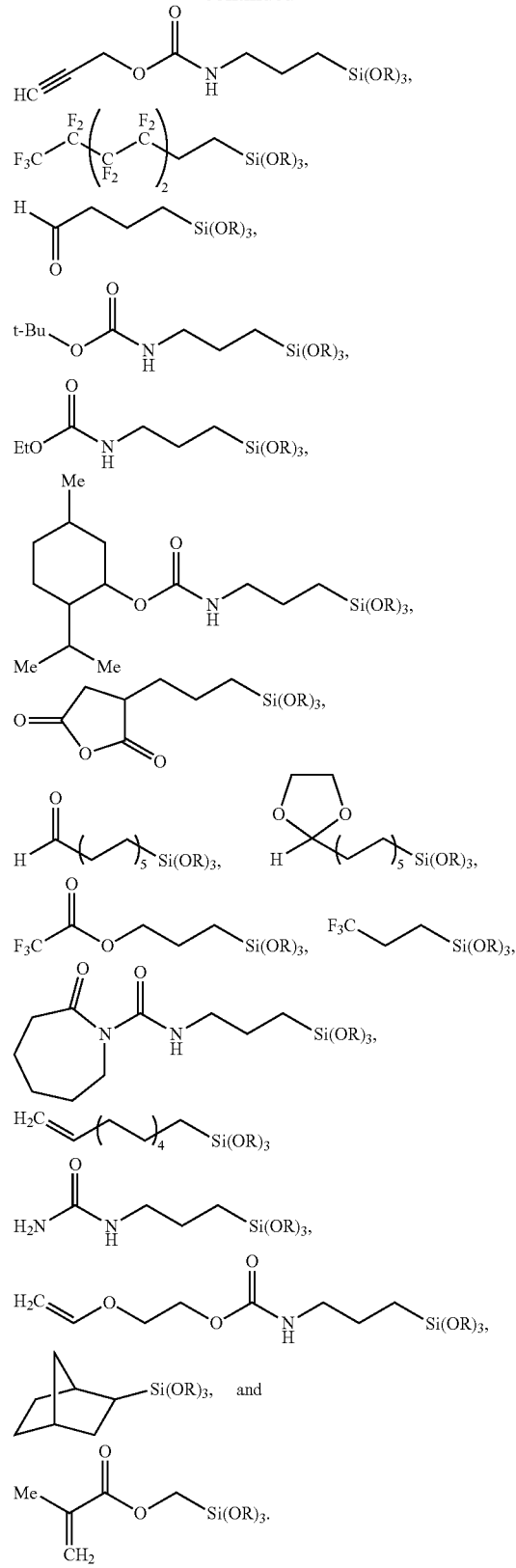
2. The hardmask composition as claimed in claim 1, wherein the organosilane polymer is present in an amount of about 1 to about 50 parts by weight and the solvent is present in an amount of about 50 to about 99 parts by weight, based on 100 parts by weight of the hardmask composition.

3. The hardmask composition as claimed in claim 1, wherein the molar percentage of alkoxy groups in the organosilane polymer is about $1 \times 10^{-2}$ mol % to about 25 mol % with respect to silicon (Si) atoms.

4. The hardmask composition as claimed in claim 1, further comprising at least one additive including at least one of a crosslinker, a radical stabilizer, and a surfactant.

5. The hardmask composition as claimed in claim 1, wherein the solvent includes at least one of acetone, tetrahydrofuran, benzene, toluene, diethyl ether, chloroform, dichloromethane, ethyl acetate, propylene glycol methyl ether, propylene glycol ethyl ether, propylene glycol propyl ether, propylene glycol methyl ether acetate, propylene glycol ethyl ether acetate, propylene glycol propyl ether acetate, ethyl lactate, and γ-butyrolactone.

6. The hardmask composition as claimed in claim 1, wherein x, y and z satisfy the relations $x+y=4$, $0.4 \leq x \leq 3.96$, $0.04 \leq y \leq 3.6$, and $4 \times 10^{-4} \leq z \leq 1$.

7. The hardmask composition as claimed in claim 1, wherein Ar is a moiety bound to silicon of the organosilane polymer, the silicon-bonded Ar moiety being a hydrolyzed moiety of a second compound selected from:

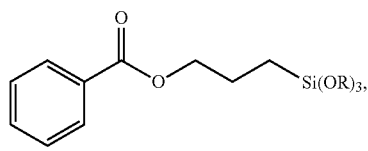

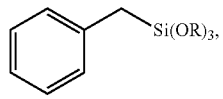

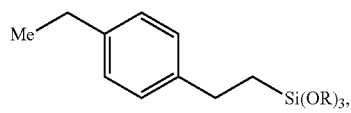

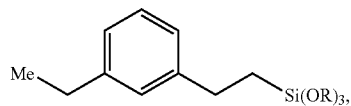

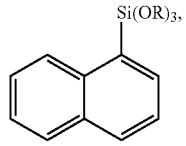

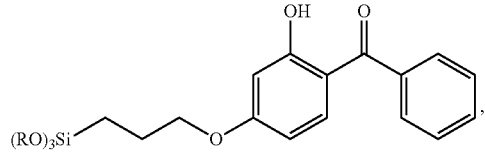

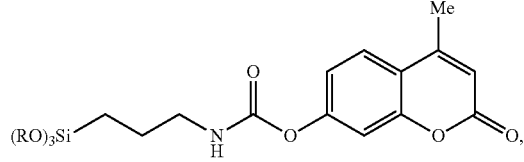

-continued

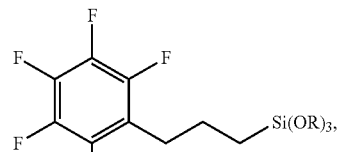

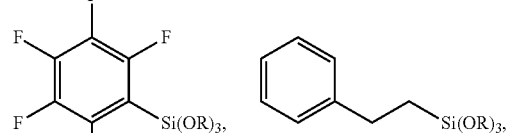

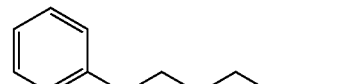

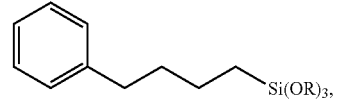

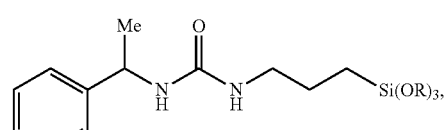

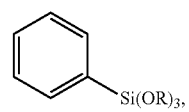

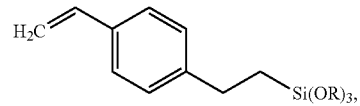

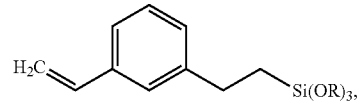

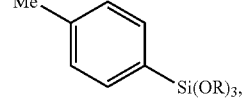

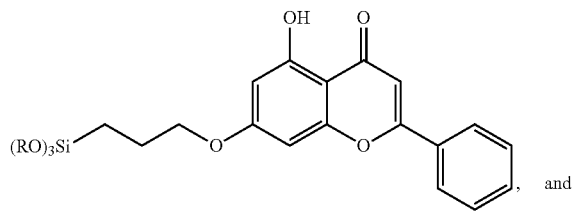

, and

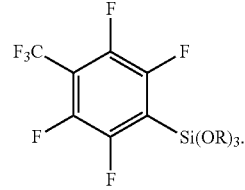

8. The hardmask composition as claimed in claim 7, wherein the second compound is selected from:

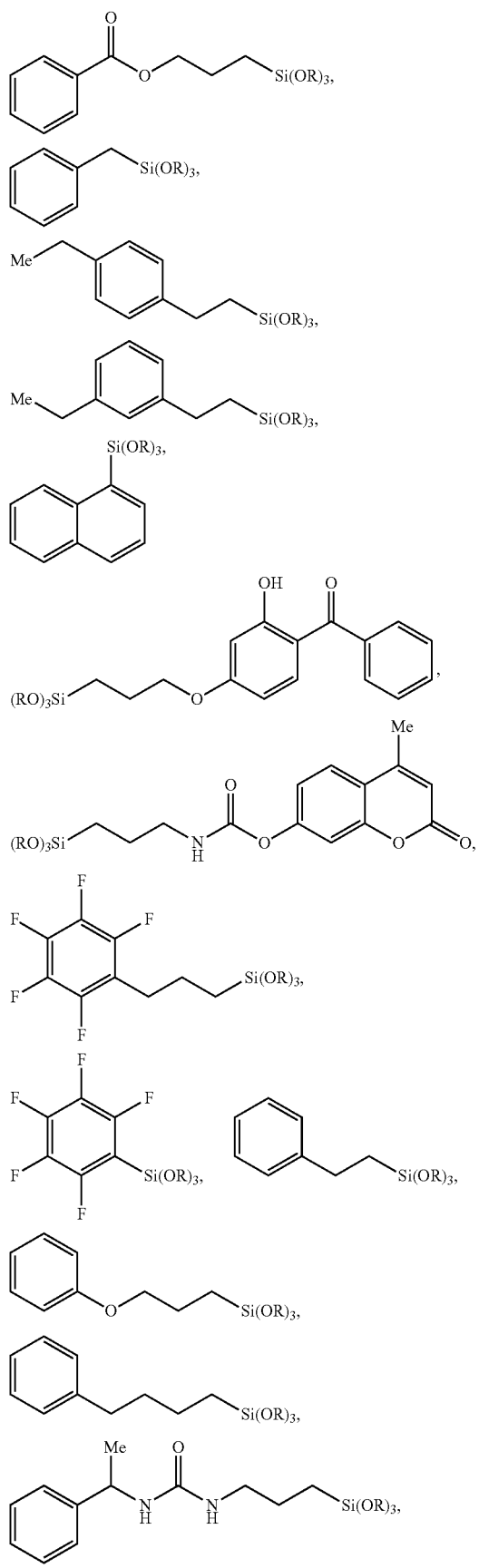

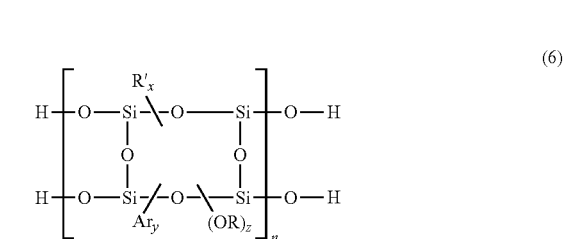

9. The hardmask composition as claimed in claim 1, wherein the crosslinking catalyst includes at least one of amidosulfobetain-16, (−)-camphor-10-sulfonic acid ammonium salt, ammonium formate, triethylammonium formate, trimethylammonium formate, tetramethylammonium formate, pyridinium formate, ammonium acetate, triethylammonium acetate, trimethylammonium acetate, tetramethylammonium acetate, and pyridinium acetate.

10. The hardmask composition as claimed in claim 9, wherein the crosslinking catalyst includes at least one of amidosulfobetain-16, ammonium formate, triethylammonium formate, trimethylammonium formate, tetramethylammonium formate, pyridinium formate, ammonium acetate, triethylammonium acetate, trimethylammonium acetate, tetramethylammonium acetate, and pyridinium acetate.

11. A method of preparing a hardmask composition, the method comprising:
hydrolyzing a first compound to form a first hydrolysate, hydrolyzing a second compound to prepare a second hydrolysate, polycondensing the first hydrolysate and the second hydrolysate to form an organosilane polymer; and
combining the organosilane polymer with a solvent;
wherein the organosilane polymer is represented by Formula 6:

wherein R is methyl or ethyl, Ar is an aromatic ring-containing functional group, x, y and z satisfy the relations x+y=4, 0.4≤x≤4, 0≤y≤3.6, and 4×10⁻⁴≤z≤1, n is about 3 to about 500, and R' is a moiety bound to silicon of the organosilane polymer, the silicon-bonded R' moiety being a hydrolyzed moiety of the first compound, the first compound being selected from the following compounds:
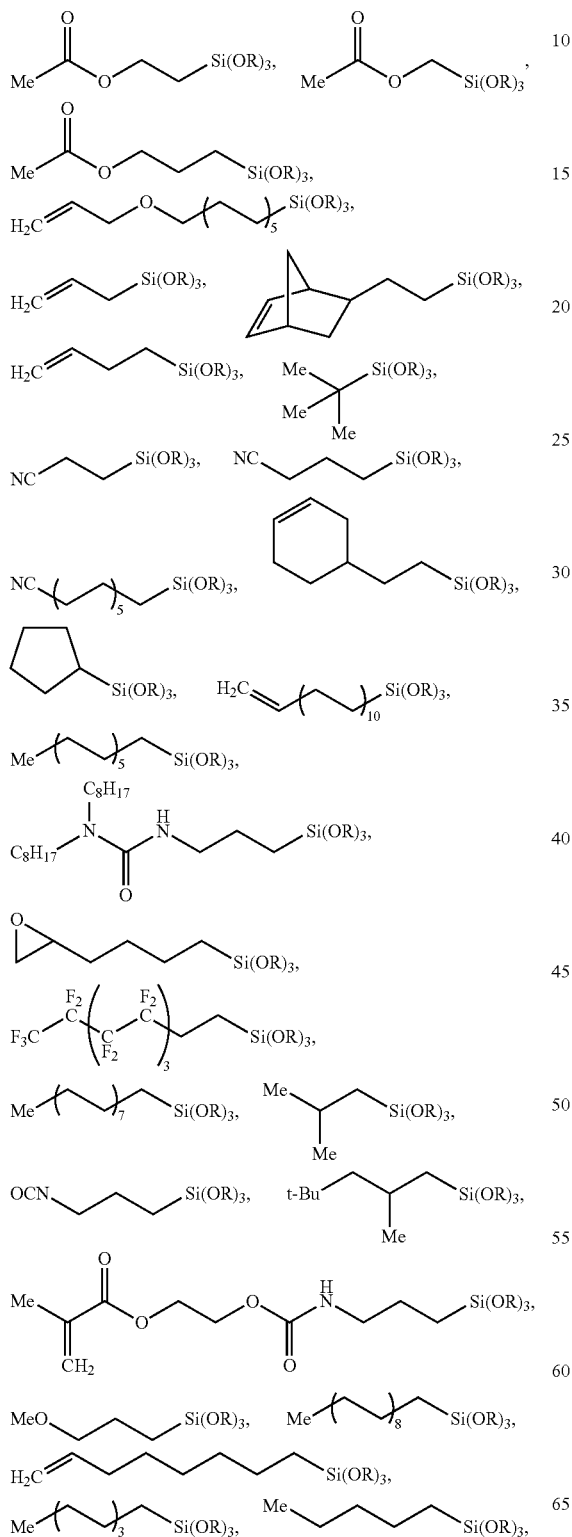
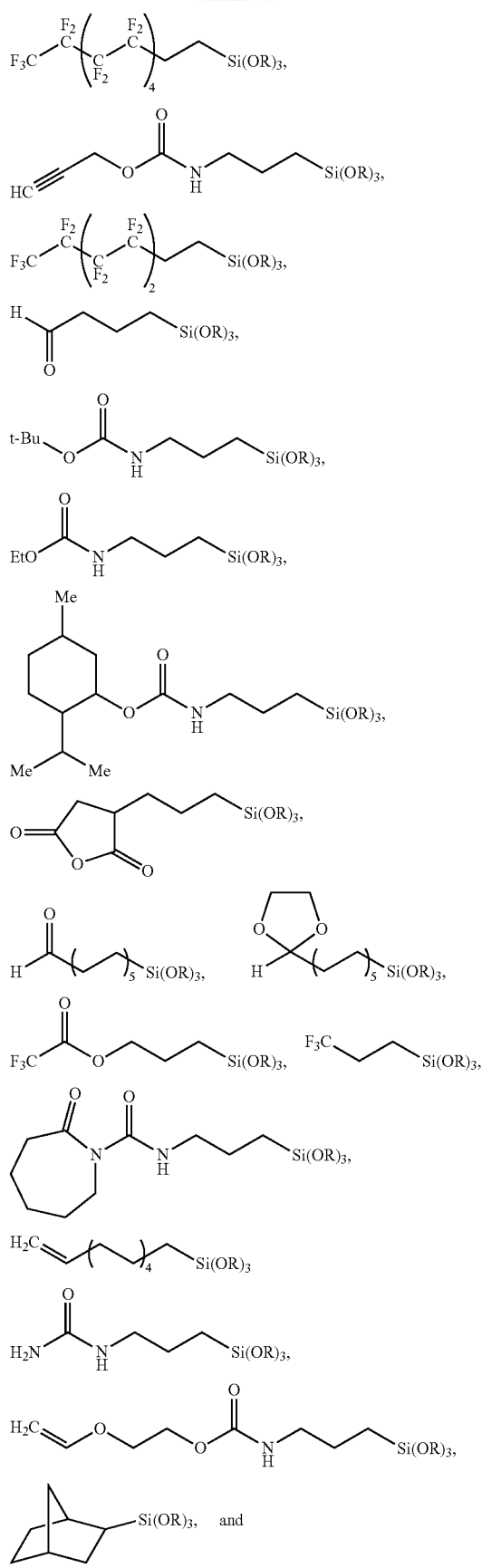

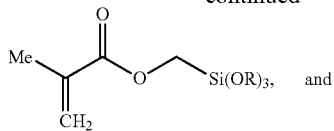
and the second compound is represented by Formula 2:

ArSi[OR]$_3$     (2)

wherein, in Formula 2, Ar is the aromatic ring-containing functional group, and R is methyl or ethyl.

12. The method as claimed in claim 11, wherein about 10 to about 99 parts by weight of the first compound and about 1 to about 90 parts by weight of the second compound, the total weight of the two compounds being 100 parts by weight, are hydrolyzed in the presence of about 0.001 to about 5 parts by weight of an acid catalyst, about 10 to about 70 parts by weight of water, and about 100 to about 900 parts by weight of a solvent to form the first hydrolysate and the second hydrolysate.

13. The method as claimed in claim 12, wherein the acid catalyst includes at least one of nitric acid, sulfuric acid, hydrochloric acid, p-toluenesulfonic acid monohydrate, and diethyl sulfate.

14. The method as claimed in claim 11, wherein the solvent includes at least one of acetone, tetrahydrofuran, benzene, toluene, diethyl ether, chloroform, dichloromethane, ethyl acetate, propylene glycol methyl ether, propylene glycol ethyl ether, propylene glycol propyl ether, propylene glycol methyl ether acetate, propylene glycol ethyl ether acetate, propylene glycol propyl ether acetate, ethyl lactate, and γ-butyrolactone.

15. The method as claimed in claim 11, wherein the polycondensation is carried out in the presence of about 0.002 to about 10 parts by weight of a base catalyst.

16. The method as claimed in claim 15, wherein the base catalyst includes at least one of trimethylamine, triethylamine, tripropylamine, tributylamine, benzylamine, dimethylbenzylamine, aniline, N-dimethylaniline, pyridine, pyrrole, pyrrolidine, piperidine, imidazole, indole, sodium hydroxide (NaOH), potassium hydroxide (KOH), and calcium hydroxide (Ca(OH)$_2$).

17. The method as claimed in claim 11, wherein Ar is a moiety bound to silicon of the organosilane polymer, the silicon-bonded Ar moiety being a hydrolyzed moiety of the second compound, the second compound being selected from:

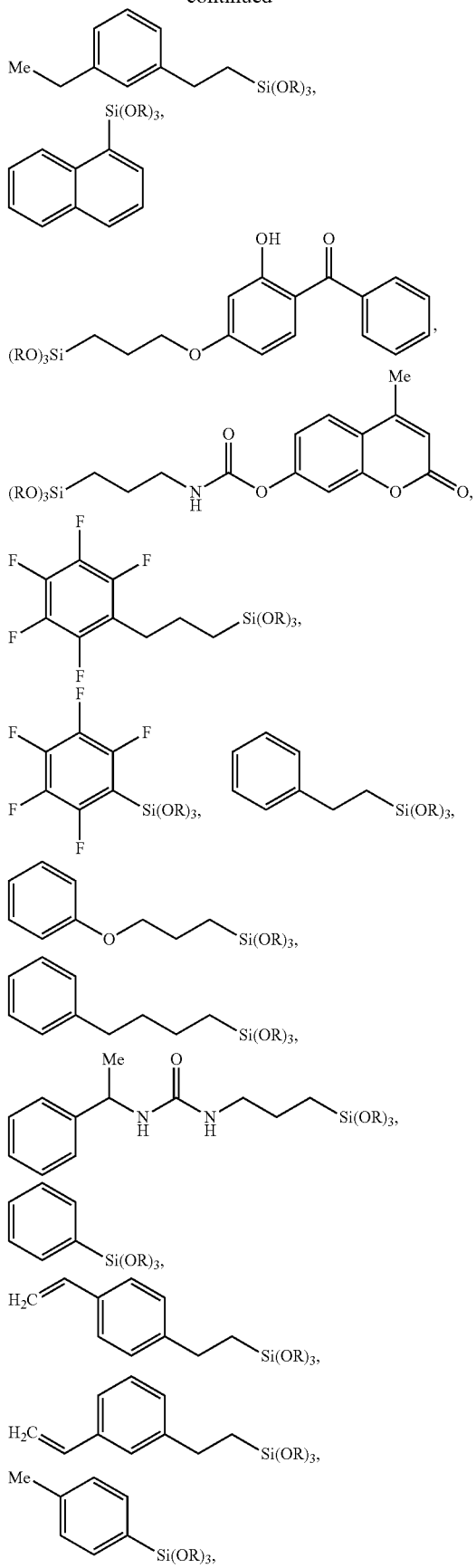

-continued
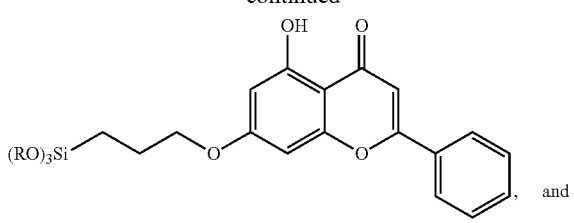, and
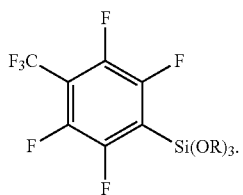.
18. The method as claimed in claim 17, wherein the second compound is selected from:
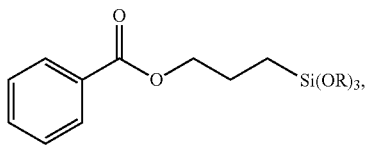
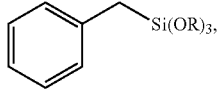
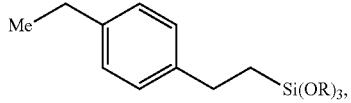
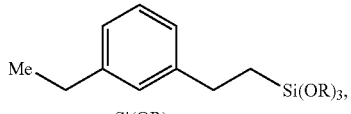
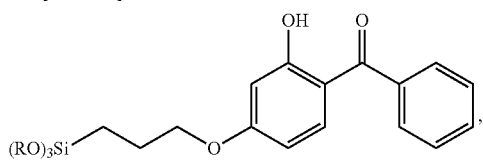,
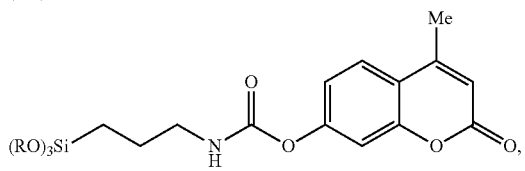
-continued
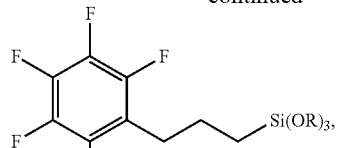
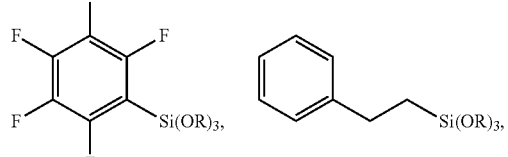
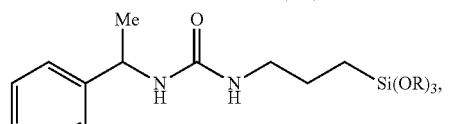
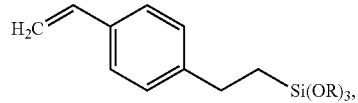
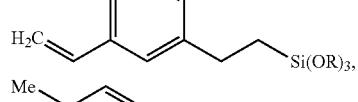
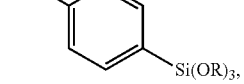
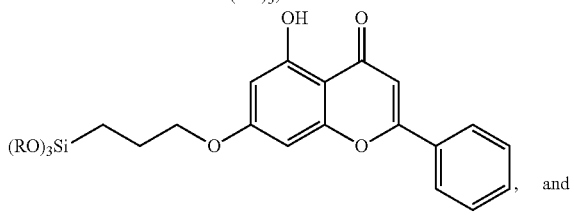, and
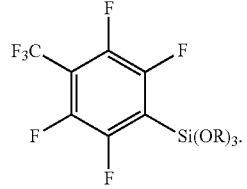.
* * * * *